(12) United States Patent
Boujamaa et al.

(10) Patent No.: US 12,047,083 B2
(45) Date of Patent: Jul. 23, 2024

(54) CIRCUITS AND METHODS FOR SET AND RESET SIGNALS

(71) Applicant: Arm Limited, Cambridge (GB)

(72) Inventors: El Mehdi Boujamaa, Valbonne (FR); Benoit Labbe, Cambridge (GB); David Michael Bull, Cambridge (GB)

(73) Assignee: Arm Limited, Cambridge (GB)

( * ) Notice: Subject to any disclaimer, the term of this patent is extended or adjusted under 35 U.S.C. 154(b) by 19 days.

(21) Appl. No.: 17/519,490

(22) Filed: Nov. 4, 2021

(65) Prior Publication Data

US 2023/0136561 A1 May 4, 2023

(51) Int. Cl.
| | |
|---|---|
| *H03L 7/091* | (2006.01) |
| *G06F 1/08* | (2006.01) |
| *G06F 1/12* | (2006.01) |
| *H03L 7/081* | (2006.01) |

(52) U.S. Cl.
CPC ............... *H03L 7/091* (2013.01); *G06F 1/08* (2013.01); *G06F 1/12* (2013.01); *H03L 7/0814* (2013.01)

(58) Field of Classification Search
CPC ......... H03L 7/091; H03L 7/0814; G06F 1/08; G06F 1/12
See application file for complete search history.

(56) References Cited

U.S. PATENT DOCUMENTS

| | | | | |
|---|---|---|---|---|
| 5,408,200 | A * | 4/1995 | Buhler | H03L 7/087 |
| | | | | 331/25 |
| 7,375,563 | B1 * | 5/2008 | Cheung | H03L 7/18 |
| | | | | 327/147 |
| 11,595,047 | B1 * | 2/2023 | Park | H03L 7/0891 |
| 2003/0007415 | A1 * | 1/2003 | Roohparvar | G11C 16/32 |
| | | | | 365/233.1 |
| 2007/0262823 | A1 * | 11/2007 | Cohen | H03D 13/003 |
| | | | | 331/45 |
| 2012/0299974 | A1 * | 11/2012 | Park | G09G 3/3688 |
| | | | | 345/690 |
| 2016/0322979 | A1 * | 11/2016 | Upadhyaya | H03L 7/197 |
| 2019/0052123 | A1 * | 2/2019 | Dina | H02M 3/33576 |
| 2020/0059260 | A1 * | 2/2020 | Ru | H03K 3/037 |
| 2021/0376719 | A1 * | 12/2021 | Pullen | G06F 1/3206 |

* cited by examiner

*Primary Examiner* — Dac V Ha
(74) *Attorney, Agent, or Firm* — Pramudji Law Group PLLC; Ari Pramudji

(57) ABSTRACT

In one particular implementation, a circuit includes: a flip flop; and an AND gate, where the circuit is configured to generate edge-triggered set and reset input signals. In another implementation, a method includes: providing, by a digital locked loop (DLL), a plurality of phase outputs; determining, by respective logic circuits, respective pulses to be selected for an output clock corresponding to each of the plurality of phase outputs; shifting respective selection windows of the pulses such that each of the selection windows fully overlap the corresponding respective determined pulses; and selecting the pulses.

18 Claims, 12 Drawing Sheets

CIRCUITS AND METHODS FOR SET AND RESET SIGNALS

I. FIELD

The present disclosure is generally related to circuit and methods to construct and generate set and reset signals.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. Nevertheless, there is an ever increasing need for computing devices to run faster, with better performance, and/or with consuming less power.

In some modern computing architecture designs, logic that is used to generate a clock for a processor or other digital circuit typically involves deficient voltage margins of a digital timing supply by failing to adjust the operating clock when substantial voltage transients occur. These detrimental voltage transients typically create timing errors in the processor and often adversely impact and/or alter the processor's capabilities, operations and performance. Thus, conventional computing circuitry typically operates at higher than necessary voltage much of the time, which adds to significant power dissipation. As such, there exists a need to improve conventional computing designs so as to improve timing latency, performance inefficiencies, and power dissipation in many applications.

In one example, due to various timing failures, extraneous jitter (i.e., added noise) at the output of a digital system can be a significant issue in adaptive clocking circuits. In certain operations, a delayed locked loop (DLL) would add clock jitter to an input jitter of a master clock. Accordingly, each output phase of the DLL would be "noisier" than the input clock signal. Such added jitter cannot be filtered by a shifter circuit. Hence, there is a need in the art, to provide for adaptive clocking systems, circuits and methods to account for extraneous jitter, and keep it as low as possible, such that digital systems may run faster and/or with consuming less power.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
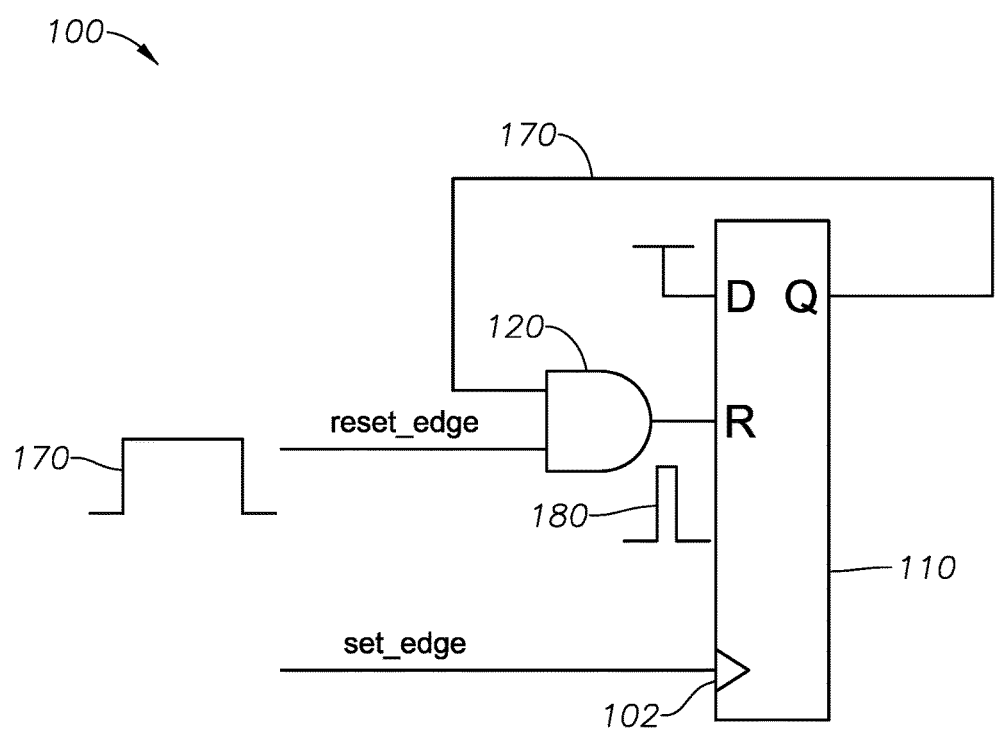
FIG. 1 is a circuit diagram implementable with example circuits and methods.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a circuit to provide edge-sensitivity (i.e., edge-triggering) for set and reset signals of an output clock is disclosed. The circuit includes: a flip flop; and an AND gate, where the circuit is configured to generate edge-sensitive set and reset signals.

According to one implementation of the present disclosure, a clock reconstruction circuit to provide edge-sensitivity for set and reset signals of an output clock is disclosed. The circuit includes: a plurality of logic circuits configured to generate set and reset signals; and an edge-triggered reset-set (RS) latch configured to receive the set and reset signals, and output edge-triggered set and reset signals.

According to implementation, a method of adaptive window synchronization includes: providing, by a digital locked loop (DLL), a plurality of phase outputs; determining, by respective logic circuits, respective pulses to be selected for an output clock corresponding to each of the plurality phase outputs; shifting respective selection windows of the pulses such that each of the selection windows fully overlap the corresponding respective determined pulses; and selecting the pulses.

Particular implementations of the present disclosure are described below with reference to the drawings. In the description, common features are designated by common reference numbers throughout the drawings.

Advantageously, inventive schemes and techniques provide for accuracy in generating a reconstructed clock signal used internally in a semiconductor chip. Such a clock signal may be reconstructed to be a "slowed down" version of an internal reference clock signal to accommodate for voltage droop such that the voltage droop would not impact digital circuit functionality.

To provide for accuracy of such a reconstructed clock signal, inventive aspects include circuits, systems, and methods for shifting of clock masks of and for providing edge-sensitive (i.e., edge-triggered) clock signals in physical layout design. For example, inventive aspects provide a full clock reconstruction circuit including an edge-sensitive reset-set (RS) latch (i.e., dedicated flip-flop), and employ an adaptive window synchronization methodology. Such inventive aspects can be combined to provide for a robust and flexible solution in generating, with accuracy and precision, set and reset output clock signals.

In certain implementations, a flexible clocking circuit (i.e., clock reconstruction circuit) may be utilized to generate a regulated clock for a central processing unit (CPU), a graphics processing unit (GPU), or some other similar digital circuit, where the generated CPU/GPU clock allows for a reduction of voltage margin of the digital supply by automatically slowing down the CPU/GPU clock when a substantial voltage transient occurs. By lowering CPU/GPU clock frequency when a voltage droop starts occurring, the CPU/GPU current drops to thereby ease the strain on the power delivery network (PDN) of the CPU/GPU and reduce overall voltage droop. The constant added supply voltage margin may therefore be reduced by diminution of transient voltage droop, which reduces overall circuit power dissipation (causing a lower supply voltage) by momentarily reducing digital circuit speed (i.e., CPU/GPU frequency) without degradation of a user's experience in some computing based applications. Various implementations of clock construction architecture and schemes and techniques related thereto will be described in greater detail herein with reference to FIGS. 1-10.

Referring to FIG. 1, an example circuit 100 is shown. The circuit 100 may operate as an edge-sensitive set and reset circuit (i.e., edge-triggered latch, a dedicated flip-flop) that includes a flip-flop 110 and an AND gate 120. As an example, the circuit 100 may be configured to generate edge-triggered (i.e., edge-sensitive) set and reset output signals. In certain cases, the circuit 100 may include solely the flip-flop 110 and the AND gate 120. Also, as described in other implementations, the circuit 100 can be a portion of a clock reconstruction circuitry (e.g., with reference to FIG. 2 and FIGS. 7A-C).

In example embodiments, to have a robust clock reconstruction circuit for use in digital circuits, it would be preferable to construct an reset-set (RS) latch (with feedback) to be "edge-sensitive" (i.e., edge-triggered) rather than "digital-level" sensitive (i.e., level-sensitive) for output signals. As may be appreciated, the longer the sensitivity of the circuit, the greater the likelihood of preventing or catching glitches or noise in the output signals. In one example operation, when an edge signal arrives at the inventive edge-sensitive RS latch 100 (i.e., latch 100), the latch 100 would become "sensitive" (i.e., when the edge signal is completed (e.g., at the end of the rising edge of a pulse period)).

In certain implementations, the dedicated flip-flop 100 may be a D-flip-flop (i.e., a delay flip flop, a data flip-flop). As illustrated, an output (Q) of the latch 100 may be a first input of the AND gate 120. Also, a reset input signal (reset_edge) may be a second input of the AND gate 120, where the output of the AND gate 120 would transition into an edge-triggered reset signal. In some instances, the set input signal (set_edge) may correspond to a rising edge of an output clock signal (corresponding to a particular DLL rising edge output phase) of a phase selector circuit. Also, the reset input signal may correspond to a falling edge of the output clock signal (corresponding to a different DLL rising edge output phase) of the phase selector.

In contrast to circuit 100, upon utilizing a level-sensitive RS latch, when an example set signal is set to a digital "1", the level-sensitive RS latch would force the output to digital "1" continually. Also, unlike circuit 100, level-sensitive circuits, in general, are susceptible to supply noise, glitches and other such similar signal issues. Moreover, due to level-sensitive RS latches including multiple gates and the placement of such level-sensitive RS latches in digital synthesis tools, tracking of the set and reset signal in terms of timing would be both time-consuming and difficult. For instance, during place and route phases of an example implementation, gates would be placed away from one another and timings between such gates would not be "a priori" known (e.g., dependent on: the design, its density, routing rules, etc.). Advantageously, in contrast, the inventive circuit 100 can be "self-contained" in a standard cell. Hence, the timings inside the cell block would be substantially predictable (as the cell block would not be split). Furthermore, as another comparison to level-sensitive RS latches, the circuit 100, by including a flip-flop, would also provide for greater area efficiency in the standard cell.

As an advantage, the inventive aspects implement a D-flip-flop where the D input of the flop is set to a digital "1", and the set edge is placed directly to the clock input 102 (i.e., set edge signal input) of the dedicated flip-flop 100 (i.e., D-flip-flop 100). Accordingly, when a set signal (set_edge) arrives, the output (Q) would then transition to a digital "1". Hence, by construction, the set edge signal input 102 would be edge-sensitive, as the set signal arrives directly to an edge-sensitive input of the D-flip-flop 100. Furthermore, in certain cases, while the internal reset input (R) of the flip-flop 110 would be edge-sensitive, an incoming input reset signal (reset_edge) may not be. Accordingly, by implementing a feedback 170 from the Q output to the AND gate 120 in the circuit 100, a "pseudo"-edge sensitive reset signal and a fully edge sensitive set signal may be implemented.

In an example operation of the circuit 100, the reset input signal transitions to a "1" when a pulse (reset_edge) arrives, and thus, the internal reset input (R) would also go to a digital "1". However, as the internal reset input (R) transitions to "1" as a reset, the output (Q) transitions to a digital "0". Correspondingly, because the Q output transitions to "0" through feedback 170 through the AND gate 120, the duration of the pulse 170 (e.g., reset_edge) would shorten significantly (i.e., to a "very" short pulse 180 in FIG. 1)). Accordingly, the very short pulse 180 would transform the circuit 100 to be "edge sensitive" to the input reset signal (reset_edge). In certain examples, the duration of the very short pulse 180 may be approximately 20 ps (e.g., the duration from the clock to the Q output of the flip-flop 110 combined with a gate delay) in advanced technologies.

Figure 2:
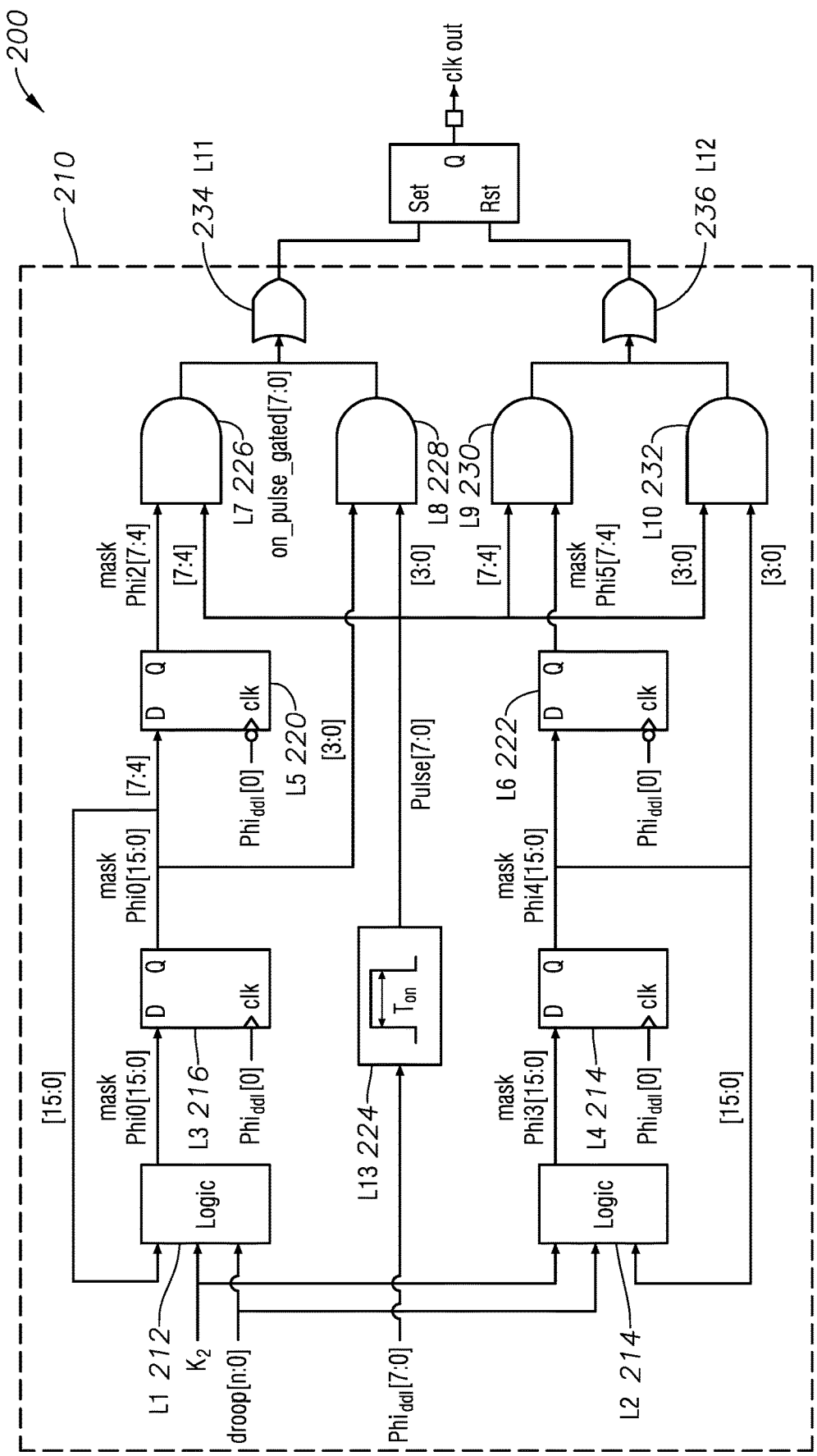
FIG. 2 is a circuit diagram implementable with example circuits and methods.

Referring to FIG. 2, an example circuit 200 (i.e., full clock reconstruction circuit, phase shifter and selector architecture) is shown according to example embodiments. As illustrated, FIG. 2 depicts a system 200 including a plurality of logic circuits 210 configured to generate set and reset signals (set and reset) and an edge-triggered reset-set (RS) latch (i.e., dedicated flip-flop circuit) 202 configured to receive the set and reset signals, and output edge-triggered set and reset signals (i.e., clk out).

In various implementations, the phase shifter and selector architecture 200 may be implemented as a system or a device having integrated circuit (IC) components that are arranged and coupled together as an assemblage or combination of parts that provide for physical circuit designs and related structures. In some instances, a method of designing, providing and building the clocking architecture 200 as an integrated system or device may involve use of various IC circuit components described herein so as to implement clock phase-shifting and phase-selecting schemes and techniques associated therewith. Also, the clocking architecture 200 may be integrated with computing circuitry and related components on a single chip, and the clocking architecture 200 may be implemented in various embedded systems for various automotive, electronic, mobile, server and Internet-of-things (IoT) applications.

As illustrated in FIG. 2, the plurality of logic circuits 201 (e.g., L1 to L12) include: first and second state machine logic (L1, L2) (212, 214), first, second, third, and fourth data latches (i.e., first, second, third, and fourth D-flip-flops) (L3, L4, L5, L6) (216, 218, 220, 222); a pulser circuit (L13) 224; first, second, third, and fourth AND gates (or NAND gates) (L7-L10) (226, 228, 230, 232); and first and second OR (or NOR) gates (L11-L12) (234, 236).

In certain implementations, the clock reconstruction circuit (e.g., circuit 200 in FIG. 2 or circuit 700 in FIGS. 7A-C) may either include at least some portion of or be coupled to the flexible clocking architecture (not shown). The flexible clocking architecture can refer to multi-stage circuitry having various circuits that are coupled together to perform various logical and timing related operations. For instance, in some implementations, the flexible clocking architecture may be configured to generate a CPU_CLK signal from a reference clock signal (REF_CLK) and then modulate the output frequency of the CPU_CLK according to changes in the supply voltage (Vdd_core) of the CPU, GPU or similar digital circuit. Also, in some instances, the CPU_CLK may refer to a GPU clock (GPU_CLK) for applications involving a graphics processing unit (GPU) or similar digital processing circuitry.

The flexible clocking architecture may have a digital locked loop (DLL) circuitry (e.g., that receives a clock signal (PLL_CLK) and provides one or more phase-shifted pulse signals (Phi_DLL [0]-[7]) based on the clock signal (PFF_CLK). The first circuitry may refer to a digital locked loop (DLL) circuit that receives the clock signal (PFF_CLK) as a phase locked loop (PLL) clock signal. In some instances, the phase-locked loop (PLL) circuit would generate a high frequency clock-based signal (PLL_CLK) from a lower frequency reference oscillator signal (REF_CLK), and this high frequency clock base signal (PLL_CLK) would feed a digital locked loop (DLL) circuit that tracks the PLL output and generates phase-shifted clock outputs, Phi_DLL[7:0]. Also, a voltage monitoring circuit (e.g., droop detect) can monitors the CPU core voltage (Vdd_core) at the high frequency clock base signal (PLL_CLK) and also detects any voltage droop on the CPU core voltage (Vdd_core).

In addition, the flexible clocking architecture may have droop detect circuitry that receives an input voltage (Vdd_core), receives the clock signal (PLL_CLK), and provides an internal control signal (INT_CTL) based on the input voltage (Vdd_core) and the clock signal (PLL_CLK). The droop detection circuit (droop detect circuit) receives the input voltage (Vdd_core) as a core voltage and then provides the internal control signal (INT_CTL) as a digital internal control signal having a number (n) of digital internal control signals [n:0]. Moreover, in some instances, the internal control signal (INT_CTL) may refer to one or more time-to-digital conversion signals, such as, e.g., tdc[n:0] signals.

The flexible clocking architecture may have phase shifter circuitry that receives the internal control signal (INT_CTL), receives the one or more phase-shifted pulse signals (Phi_DLL [0]-[7]), and provides an output clock signal (DLL_CLK) based on the internal control signal (INT_CTL) and the one or more phase-shifted pulse signals (Phi_DLL [0]-[7]). The phase shifter circuitry would provide the output clock signal (DLL_CLK) as a digital output clock signal. In some instances, the flexible clocking architecture operates to combine the DLL phases Phi_DLL[0:7] from the DLL and also uses the phase shifter circuit to generate the digital output clock (DDL_CLK) according to the droop detect output signal (INT_CTL). As such, the flexible clocking architecture operates to select a phase that resets and sets an internal RS latch (e.g., circuit 100) that is configured to generate the digital output clock (DDL_CLK), while maintaining timing conditions during operation of logic gates and operating within a single cycle.

The flexible clocking architecture may have a phase locked loop (PLL) circuit that receives a reference clock (REF_CLK) from an external source, generates the phase locked loop clock signal (PLL_CLK), and then provides the phase locked loop clock signal (PLL_CLK) to the digital locked loop circuit. The phase locked loop (PLL) circuit would receive the reference clock (REF_CLK), generate the phase locked loop clock signal (PLL_CLK), and then provide the phase locked loop clock signal (PLL_CLK).

In some implementations, the droop detection circuit may be configured to receive the core voltage (Vdd_core) from an external supply, receive the phase locked loop clock signal (PLL_CLK) from the phase locked loop circuit, and then generate the digital internal control signal (INT_CTL) based on the core voltage (Vdd_core) and the phase locked loop clock signal (PLL_CLK). Further, the droop detection circuit may also be configured to provide the digital internal control signal (INT_CTL) to the phase shifter circuit.

In various implementations, the phase shifter circuit may be configured to operate as a rotating phase selector for intelligent clock stretching of high performance digital circuits. Also, the one or more phase-shifted pulse signals (Phi_DLL [0]-[7]) may refer to multiple phase-shifted pulse signals with each phase-shifted pulse signal having a shifted phase with respect to each other phase-shifted pulse signal.

In various implementations, the external computing device refers to a processor for use with a central processing unit (CPU) and/or a graphics processing unit (GPU), and the scaled digital output clock signal (CPU_CLK) may refer to a CPU clock signal for the processor and/or CPU/GPU. The flexible clocking circuitry may operate as a device that is configured to generate the CPU clock signal for the CPU (or GPU) that allows for reduction of a voltage margin of the core voltage by automatically slowing down the CPU clock when a large voltage transient occurs in the core voltage. The flexible clocking circuitry 104 may operate as a device that is configured to lower a clock frequency of the CPU clock when a voltage droop starts to occur in the core voltage, and when current to the CPU drops, the device reduces the voltage droop in the core voltage. Also, the flexible clocking circuitry may operate as a device that is configured to momentarily reduce digital circuit speed of the CPU/GPU by lowering clock frequency of the CPU clock when a voltage droop occurs in the core voltage.

In some implementations, the flexible clocking architecture may provide for an adaptive clock generation circuit for high performance CPUs and/or high performance CPUs GPUs, and also, the flexible clocking architecture may use various circuitry that is configured for automatic clock stretching when a supply voltage droop is detected. Also, the flexible clocking architecture may have various circuitry that is configured to select at least one specific CPU/GPU clock phase among multiple phase-shifted clock phases to dynamically stretch the CPU/GPU clock for a digital system (e.g., CPU, GPU or similar) when a voltage droop occurs.

Referring now to FIG. 2, in some implementations, first state machine logic (L1) may receive: a droop[n:0] signal from a droop detector (not shown), a feedback signal mask Phi0[15:0] and a K2 signal (e.g., a DC signal (value) that may be added on top of the ADC value to define a "stretch" value), and provide an output signal mask Phi0[15:0]. Also, second state machine logic (L2) may also receive: a droop [n:0] signal from the droop detector (not shown), receive a feedback signal mask Phi0[15:0], and provide an output signal mask Phi0[15:0].

The first and second data latches L3 and L4 may each receive, respectively, the output signal mask Phi0[15:0] from the first and second state machine logic (L1, L2). In combination, the first state machine logic L1 and the first latch L3 may correspond to the state machine for the "set" signal. while the second state machine logic and the second latch may correspond to the state machine for the "reset" signal. Separately, a pulser circuit L12 would receive as an input the Phi ddl [7:0] signal from a delayed-locked loop (DLL) (not shown) as a clock signal and output one or more pulse signals, such as, e.g., Pulse[7:0].

In some implementations, the third data latch (L5) (i.e., D-flip-flop) may receive a first part [7:4] of the output signal mask Phi0[15:0] from the first data latch (L3), receive the Phi_DLL[0] signal from the DLL (not shown) as a clock signal (clk), and provide an output signal maskPhi2[7:4]. In some implementations, the fourth data latch (L6) (i.e., D-flip-flop) may receive a first part [7:4] of the output signal mask Phi4[15:0] from the second data latch (L4), receive the Phi_DLL[0] signal from the DLL (not shown) as a clock signal (clk), and provide an output signal maskPhi5[7:4]. In certain implementations, the third and fourth data latches (L5, L6) correspond to the latches 750, 760 with reference to FIG. 7B. As illustrated in FIG. 2, while the respective clock inputs (CLK) of the latches 750, 760 is DLL[0], the implementation of FIG. 2, as shown, would not have the additional capacity to delay the DLL inputs or provide for the inventive adaptive window synchronization methodology (as described in later paragraphs with reference to, e.g., FIGS. 6, 7A-C, and 8). However, in a modified implementation of FIG. 2, where the respective clock inputs (CLK) of the latches 750, 760 is DLL [7:0] instead, DLL delaying and adaptive window synchronization capabilities (as described with reference to FIG. 7) may be realized.

Also, in one example, as an intermediary step for obtaining the set signal, first AND gate (L7) may receive the output signal mask Phi2[7:4] from the third data latch (L5), receive a first part Pulse[7:4] of the pulse signals Pulse[7:0] from the pulser circuit (L13), and provide a first on_pulse_gated signal [7:4] to the input of first OR gate L11. Furthermore, second AND gate (L8) may receive a second part [3:0] of the output signal mask Phi0[15:0] from the first latch (L3), receive a portion of [3:0] of pulse signals Pulse[7:0] from the pulser circuit (L13), and provide a second on_pulse_gated signal [3:0] to the input of first OR gate L11.

Also, in one example, as an intermediary step for obtaining the reset signal, third AND gate (L9) may receive the output signal mask Phi5[7:4] from the fourth data latch (L6), receive a first part Pulse[7:4] of the pulse signals Pulse[7:0] from the pulser circuit (L13), and provide a first on_pulse_gated signal [7:4] to the input of second OR gate L12. Also, fourth AND gate (L10) may receive a second part [3:0] of the output signal mask Phi0[15:0] from the second latch (L4), receive a portion of [3:0] of pulse signals Pulse[7:0] from the pulser circuit (L13), and provide a second on_pulse_gated signal [3:0] to the input of second OR gate L12.

Next, the first and second OR gates L11, L12 would receive respective on_pulse_gated signals [7:0], and respective provide output set and reset signals for the edge-triggered reset-set (RS) latch 202. In various implementations, the logic L1-L12 may be implemented with various types of logic circuitry, such as, e.g., latches, NAND gates, NOR gates, buffers, etc. For instance, third, fourth, fifth, and sixth logic (L3-L6) may be implemented with data latches, such as, e.g., D flip-flops (DFFs). Also, logic (L7-L10) may be implemented with either NAND or AND gates, and logic (L11-L12) may be implemented with NOR or OR gates. Nevertheless, in other implementations, various other logic configurations may be used to achieve similar results.

In some implementations, with reference to FIG. 2, the logic (L1-L12) are arranged and configured to provide for clk set signal generation with or without delayed masks (as described in later paragraphs). The logic (L1-12) may be configured to implement a function that determines which phase will be selected on the next phase rotation as a function of the current selected phase and a droop detection circuit output [n:0].

Referring to FIGS. 3-6, in another inventive aspect, an adaptive window synchronization methodology (e.g., method 900) is shown and described. For example, to select the sequence of pulses (e.g., set pulses: mdll [0], mdll [2], mdll [4], mdll [6] and then back to mdll [0] and so forth, as shown in FIG. 8), the select input of the multiplexers of the clock reconstruction circuitry (e.g., 780, 782 with reference to FIG. 7C) would select a correct DLL pulse. However, a designer would have to be mindful in how such pulses would be selected.

Figure 3:
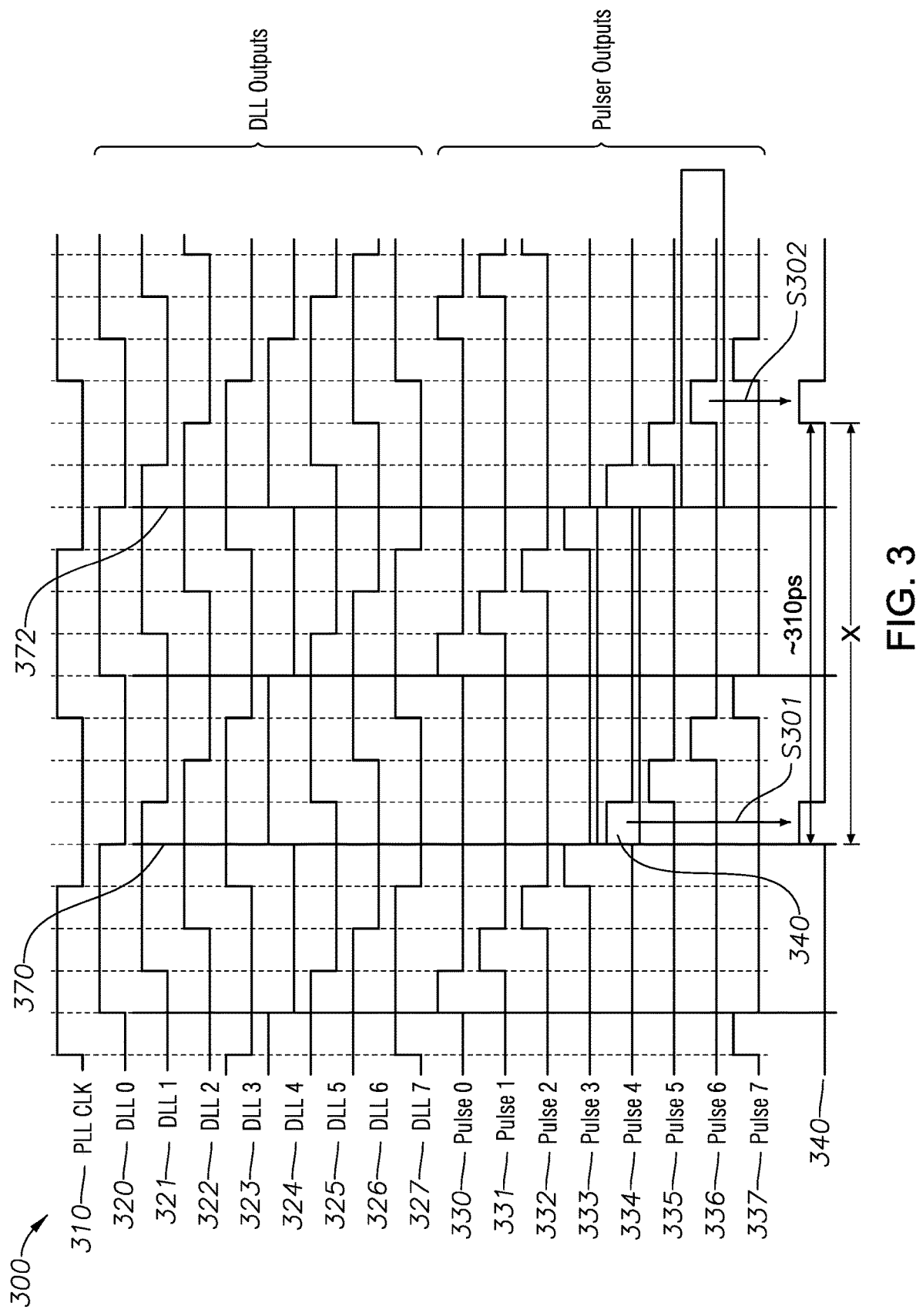
FIG. 3 is a schematic diagram implementable with example circuits and methods.

With reference to FIG. 3, example signal representations 300 of DLL outputs and Pulser outputs is shown. As illustrated, a signal depiction of the reference clock ($P_{LL}$ CLK) 310 is shown at the top, while signal depictions of each of the DLL outputs (i.e., DLL0 (320) to DLL7 (327) are shown directly below the reference clock 310 in order from DLL0 to DLL7 320-327. Also depicted, signals of each of the pulser outputs (i.e., mdll signals) (e.g., [0], mdll [2], mdll [4], mdll [6] as illustrated with reference to, e.g., FIGS. 7 and 8) are illustrated below the DLL outputs in order from Pulse 0 to Pulse 7 (330-337). As may be appreciated, each consecutive rising edge and falling edge forms a particular pulse. As shown, FIG. 3 illustrates an example of a selection of pulses for set pulses 340 for the set signal. In a similar manner, selection of pulses can be performed for reset pulses as well. In one example operation, the width of each pulse may be $\frac{1}{8}^{th}$ of a clock period (but can be other durations of an example clock period). As a desired objective, a designer would want a shorter pulse and be able to select such pulses accurately.

In an example, according to one implementation as illustrated, it may be assumed that a designer would desire to select Pulse 4 (334) and Pulse 6 (336) for a set signal. As the selection process is synchronous, a selection window for Pulse 4 (334) would be present from time points 370 (i.e., a first rising edge of DLL4 (i.e., phase 4)) to 372 (i.e., a second rising edge of DLL4) (i.e., a time duration between two rising edges of a given clock). Also, for example, a selection window for Pulse 6 (336) would be present from time points 372 (i.e., the second rising edge of DLL4) to the next rising edge (not shown as it would be off of the diagram).

In this example, if no delay was observed, the selection would occur as can be expected. Specifically, the selection window would be fully overlapping the pulse that is to be selected. Hence, at step 301 (S301), Pulse 4 is selected at the output 340, and at step 302 (S302), Pulse 6 is selected at the output 340 to generate the desired set pulses of the output signal. As illustrated, in one example case, the clock period "X" (e.g., a duration from the rising edge of one pulse to the rising edge of the next pulse) of the set output signal may be approximately 310 pico-seconds (ps).

However, if delays were to be introduced, for example due to internal circuitry, inadvertent selection of shorter pulses than intended as well as "glitches" (i.e., selection of a extraneous unintended portion of a pulse) would result. One example of such an occurrence is illustrated in FIG. 4 (which illustrates the same DLL outputs and Pulser outputs as FIG. 3).

Figure 4:
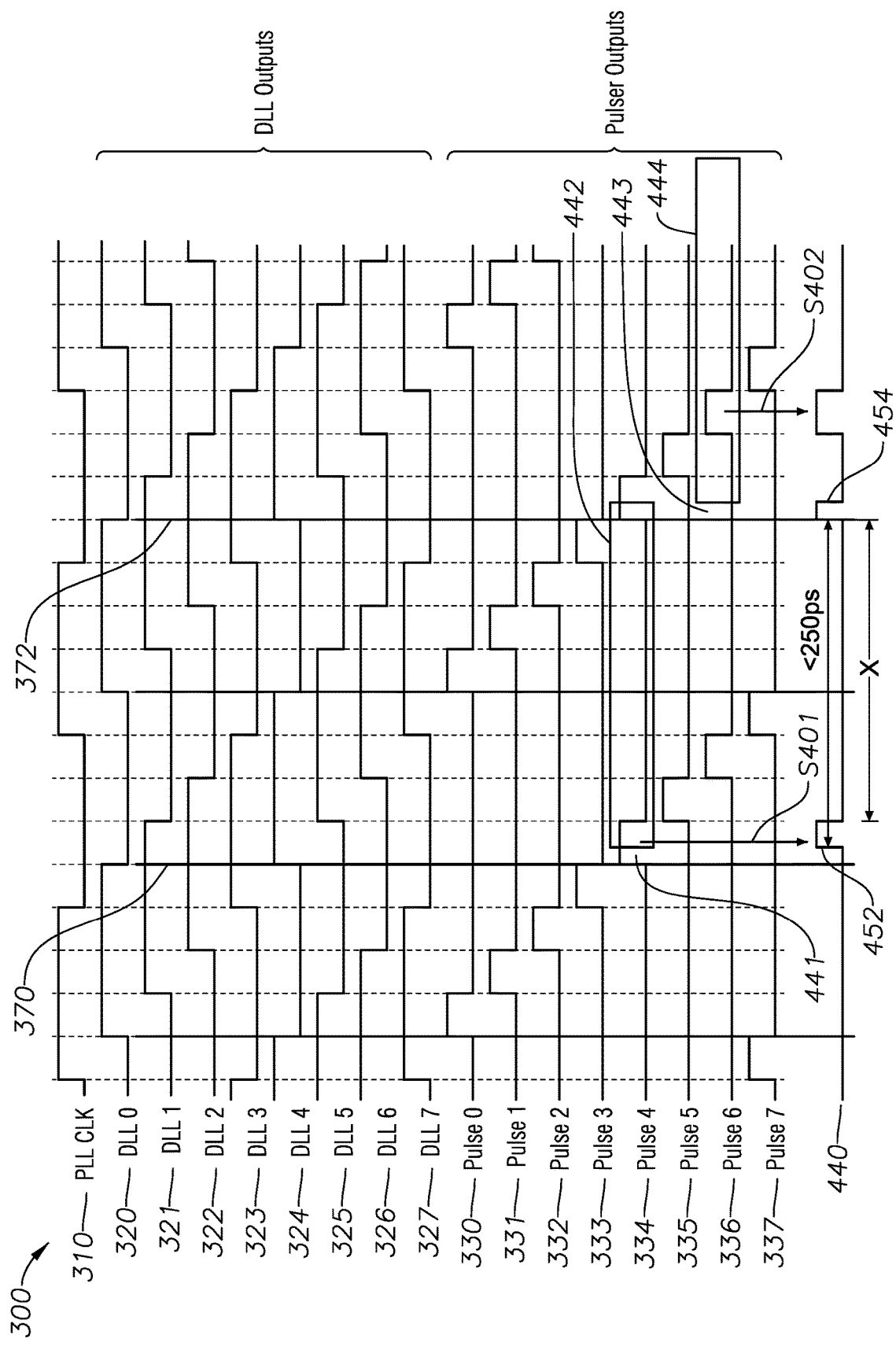
FIG. 4 is a schematic diagram implementable with example circuits and methods.

As illustrated in FIG. 4, if, for example, a first delay 441 is introduced at the beginning of selection window 442, at step 401 (S401) in the selection of Phase 4 at the output 440, a shorter pulse 452 would be selected than would have been intended. Also, as the selection window 442 would inadvertently be extended, a glitch 454 would be generated before the selection of Phase 6 in step 402 (S402). In addition, as another unintended consequence, a second delay 443 would be introduced at the beginning of selection window 444. As one example, such an occurrence would be problematic, because the rising edges of the selected pulses are utilized to either "set" or "reset" the output clock signal 440. Also, as can be observed, the clock period would be lowered to below 250 ps. Hence, while each pulse was desired to be $2/8^{th}$ of a clock period, the resultant pulse that is output turns out to be smaller. From a circuit designer's perspective, it is crucial that such a scenario would be avoided. Accordingly, to avoid the above-mentioned situation (as described with reference to FIG. 4), in certain inventive aspects, an adaptive window synchronization technique 900 (as described with reference to FIGS. 5-6 and 9) may be implemented. Advantageously, the adaptive window synchronization method can change the synchronicity of the selection windows (i.e., a clock masks).

Figure 5:
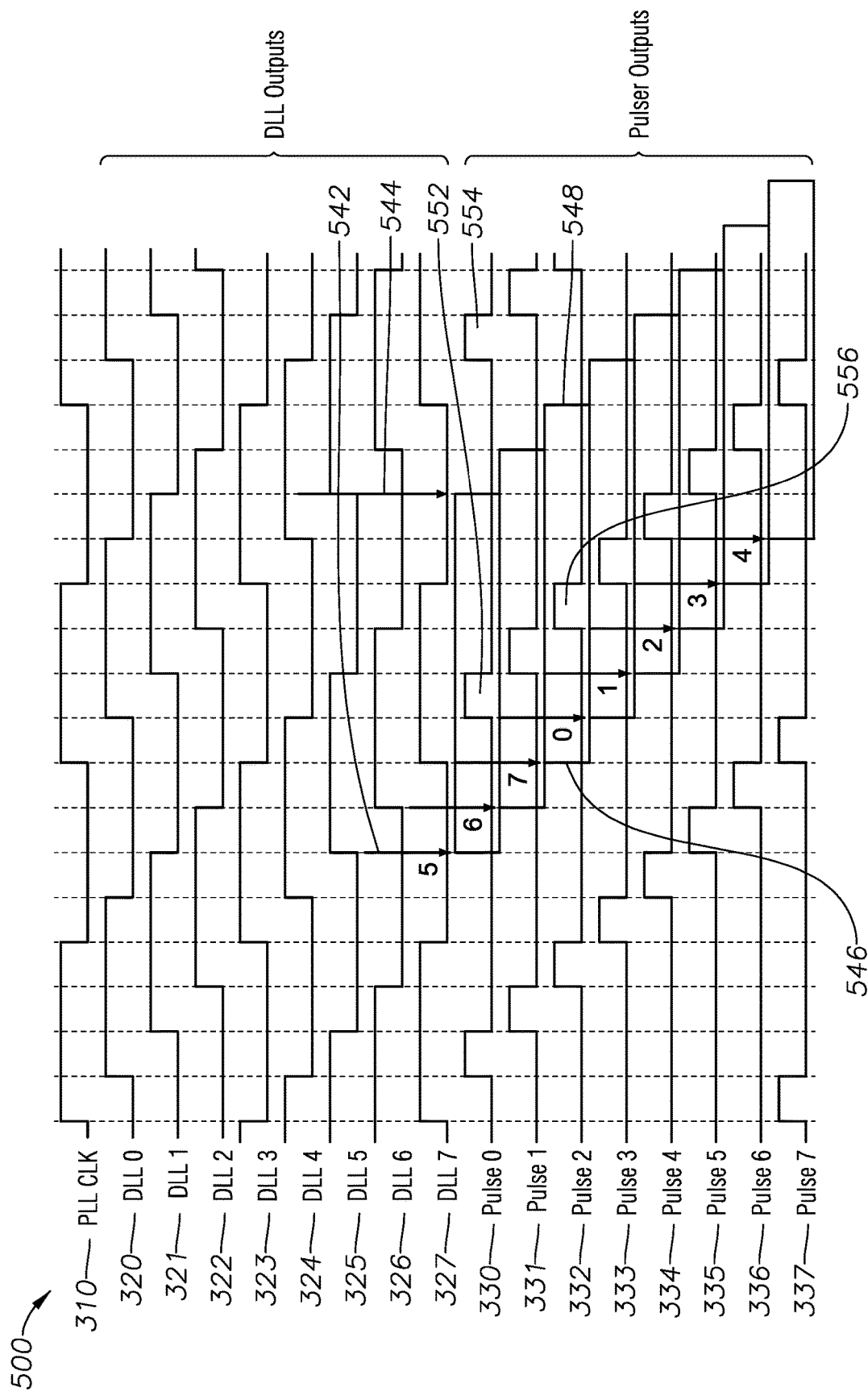
FIG. 5 is a schematic diagram implementable with example circuits and methods.
Figure 9:
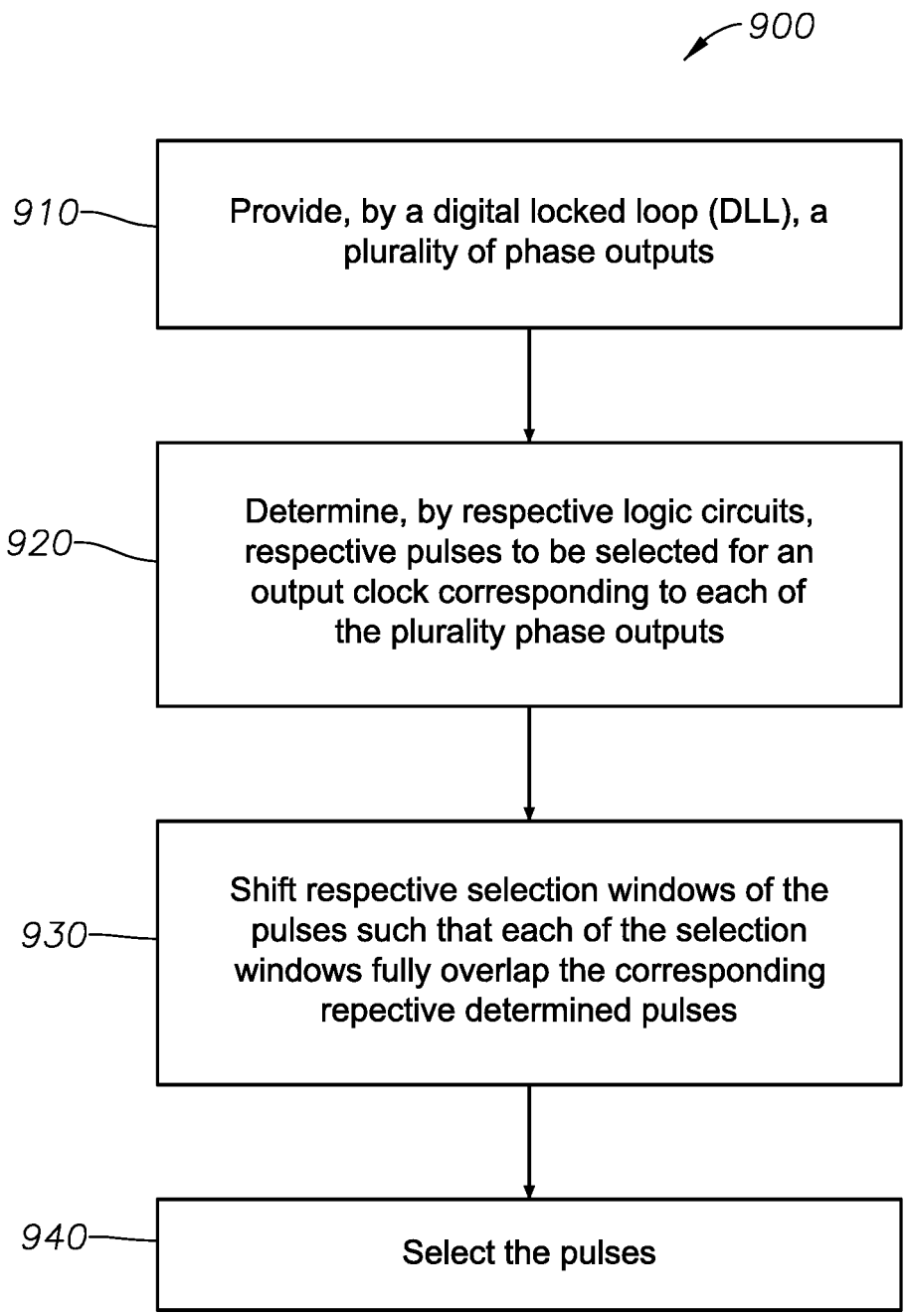
FIG. 9 is a flowchart of a particular illustrative aspect of example methods.

Referring to FIG. 5, the example signal representations 500 of the same DLL outputs and Pulser outputs as FIG. 3 is shown according to one implementation of the inventive methodology (as described as method 900 in FIG. 9). In one example operation, if, for instance, Pulse 0 (552) is intended to be selected, instead of selecting (i.e., starting) a window (i.e., a clock mask) from the rising edge of DLL output 4 (phase 4) (324) to the next rising edge of DLL output 4 (phase 4), the window may be selected from DLL output 5 (i.e., phase 5) (542) to the next rising edge of DLL output 5 (544). When this operation is performed, in this example, $3/8^{th}$ of a clock period is part of the window before the pulse 552, and $4/8^{th}$ of a clock period is after the pulse 552. As another example, if, for instance, Pulse 3 (556) is intended to be selected, the window may be selected from DLL output 0 (i.e., phase 0) (546) to the next rising edge of DLL output 0 (548). Accordingly, the pulse would be fully selected, because there would be sufficient selection space on both sides. In addition, there would also be minimal likelihood of glitches as the next pulse 554 would arrive much later than the selection window. Hence, the selection window can be synchronized with the appropriate phase at the input such that there would not be any glitches or internal delay.

As illustrated in FIG. 5, the example implementation can provide for an equivalent duration of time (i.e., a number of portions (e.g., each being $1/8^{th}$) of a clock period) for either before or after the selectable pulse. For example, in such an implementation, the pulse would be positioned in the middle of the selection window. In certain other implementations (e.g., with reference to FIG. 6), it would not be required that the same time duration be available for before and after the selectable pulse. In such other implementations, e.g., as shown in FIG. 6, advantageously, to accommodate for various logic delays, the additional flexibility of uneven and/or even durations of the selection window can be provided for prior to and after the selected pulse.

Figure 6:
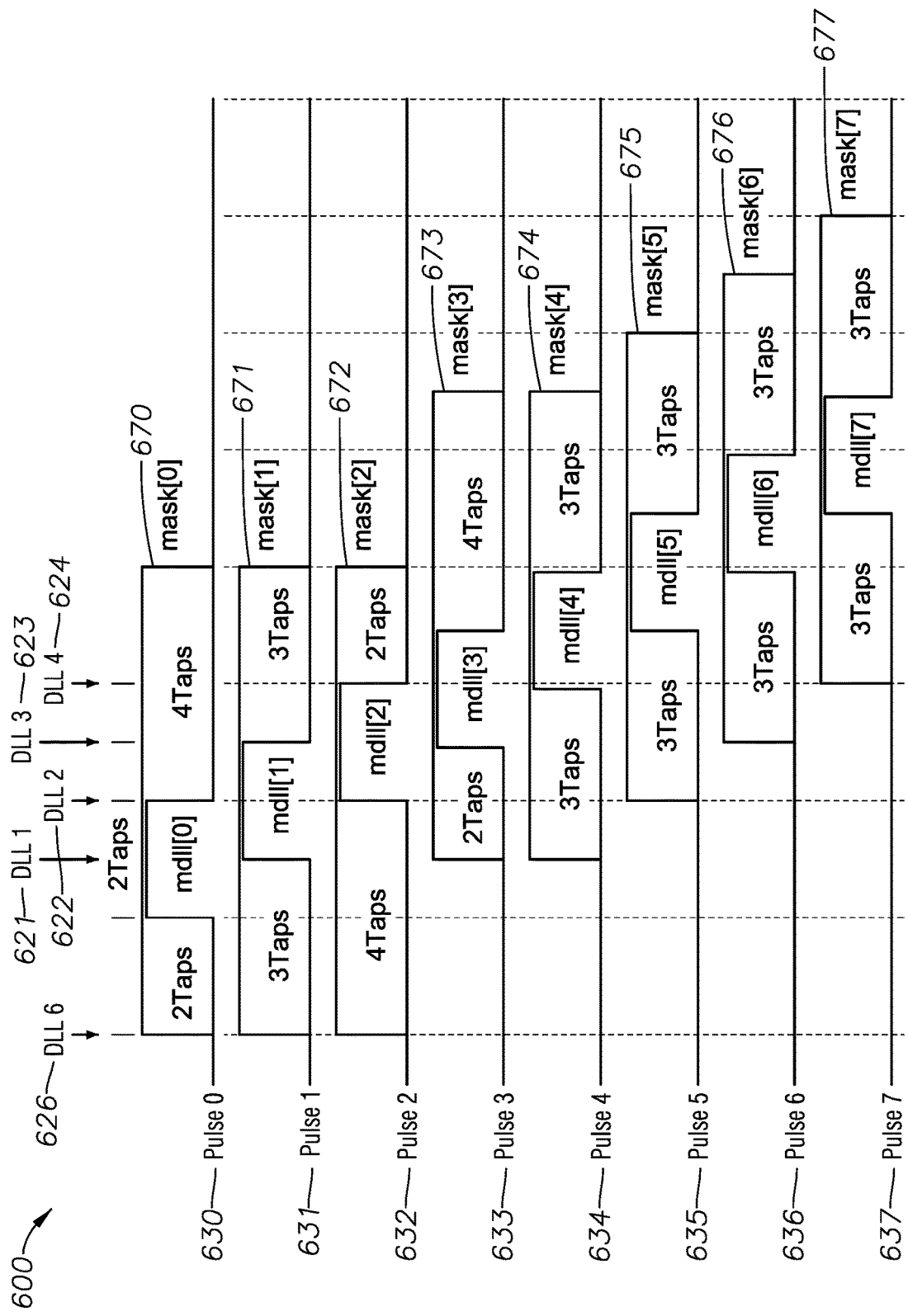
FIG. 6 is a schematic diagram implementable with example circuits and methods.

Referring to FIG. 6, an example representation 600 of selectable windows (i.e., masks) for each of selectable pulses (e.g., pulses 0-7, pulser outputs) is shown. As illustrated, FIG. 6 is one example of a simplified diagram of the seven state machines for "set", and can provide even and/or uneven durations of selection windows utilizing adaptive window synchronization according to inventive aspects herein.

In one implementation, as shown in FIG. 6, to select a particular Pulse 0, 1, or 2 (630, 631, or 632) (i.e., one of mdll[0], mdll[1], or mdll[2]), the selection window would start at, for example, DLL6 (i.e., clk 6) (626). Also, to select a particular Pulse 3 or 4 (633 or 634) (i.e., one of mdll[3] or mdll[4]), the selection window would start at, for example, DLL1 (i.e., clk 1) (621). Further, to select a particular Pulse 5 (635) (i.e., mdll[5]), the selection window would start at, for example, DLL2 (i.e., clk 2) (622); to select a particular Pulse 6 (636) (i.e., mdll[6]), the selection window would start at, for example, DLL3 (i.e., clk 3) (623); and to select a particular Pulse 7 (637) (i.e., mdll[7]), the selection window would start at, for example, DLL4 (i.e., clk 4) (624).

As shown, in a first example, for Pulse 0 (630) (i.e., mask [0]), if the selection window (670) starts at DLL6 (i.e., clk 6) (626), the selection window (670) would have: a duration of $2/8^{th}$ of a clock period (i.e., 2 Taps) before the pulse, a duration of $2/8^{th}$ of the clock period during the pulse itself (i.e., mdll[0]), a duration of $4/8^{th}$ of the clock period (i.e., 4 Taps) after the pulse. As shown, in a second example, for Pulse 1 (631) (i.e., mask [1]), if the selection window (671) starts at DLL6 (i.e., clk 6) (626), the selection window (671) would have: a duration of $3/8^{th}$ of a clock period before the pulse (i.e., 3 Taps), be a duration of $2/8^{th}$ of the clock period during the pulse itself (i.e., mdll[1]), and be a duration of $3/8^{th}$ of the clock period (i.e., 3 Taps) after the pulse.

As shown, in an third example, for Pulse 2 (632) (i.e., mask [2]), if the selection window (672) starts at DLL6 (i.e., clk 6) (626), the selection window (672) would have: a duration of $4/8^{th}$ of a clock period before the pulse (i.e., 4 Taps), a duration of $2/8^{th}$ of the clock period during the pulse itself (i.e., mdll[2]), and a duration of $2/8^{th}$ of the clock period (i.e., 2 Taps) after the pulse. As shown, in an fourth example, for Pulse 3 (633) (i.e., mask [3]), if the selection window (673) starts at DLL1 (i.e., clk 1) (621), the selection window (673) would have: a duration of $2/8^{th}$ of a clock period before the pulse (i.e., 2 Taps), a duration of $2/8^{th}$ of the clock period during the pulse itself (i.e., mdll[3]), and a duration of $4/8^{th}$ of the clock period (i.e., 4 Taps) after the pulse.

As shown, in an fifth example, for Pulse 4 (634) (i.e., mask [4]), if the selection window (674) starts at DLL1 (i.e., clk 1) (621), the selection window (674) would have: a duration of 3/8th of a clock period before the pulse (i.e., 3 Taps), a duration of 2/8th of the clock period during the pulse itself (i.e., mdll[4]), and a duration of 3/8th of the clock period (i.e., 3 Taps) after the pulse. As shown, in an sixth example, for Pulse 5 (635) (i.e., mask [5]), if the selection window (675) starts at DLL2 (i.e., clk 2) (622), the selection window (675) would have: a duration of 3/8th of a clock period before the pulse (i.e., 3 Taps), a duration of 2/8th of the clock period during the pulse itself (i.e., mdll[5]), and a duration of 3/8th of the clock period (i.e., 3 Taps) after the pulse.

As shown, in an seventh example, for Pulse 6 (636) (i.e., mask [6]), if the selection window (676) starts at DLL3 (i.e., clk 3) (623), the selection window (676) would have: a duration of 3/8th of a clock period before the pulse (i.e., 3 Taps), a duration of 2/8th of the clock period during the pulse itself (i.e., mdll[6]), and a duration of 3/8th of the clock period (i.e., 3 Taps) after the pulse. As shown, in an eighth example, for Pulse 7 (637) (i.e., mask [7]), if the selection window (677) starts at DLL4 (i.e., clk 4) (624), the selection window (676) would have: a duration of 3/8th of a clock period before the pulse (i.e., 3 Taps), a duration of 2/8th of the clock period during the pulse itself (i.e., mdll[7]), and a duration of 3/8th of the clock period (i.e., 3 Taps) after the pulse.

Figure 7A:
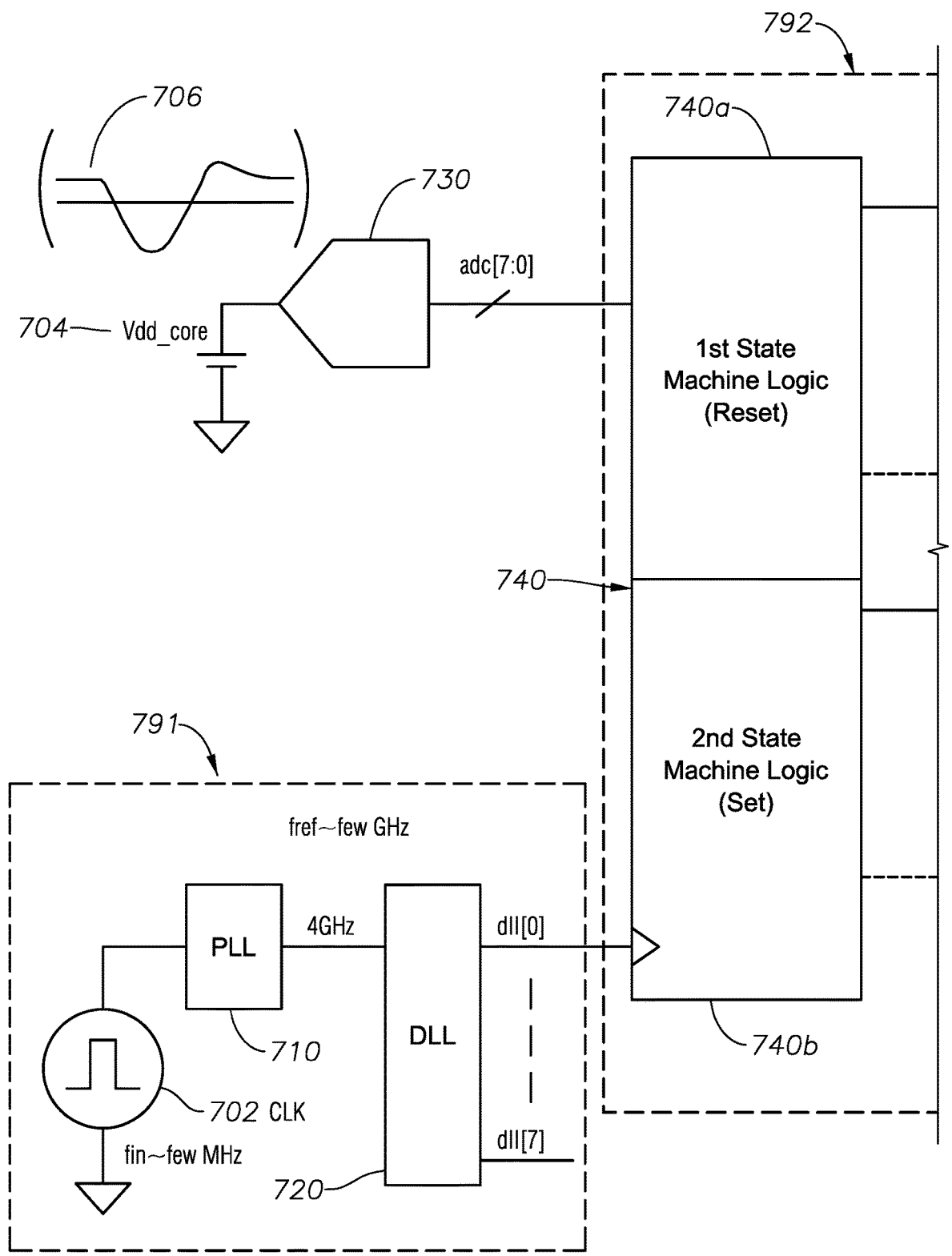
FIGS. 7A-7C is a schematic diagram implementable with example circuits and methods.
Figure 7B:
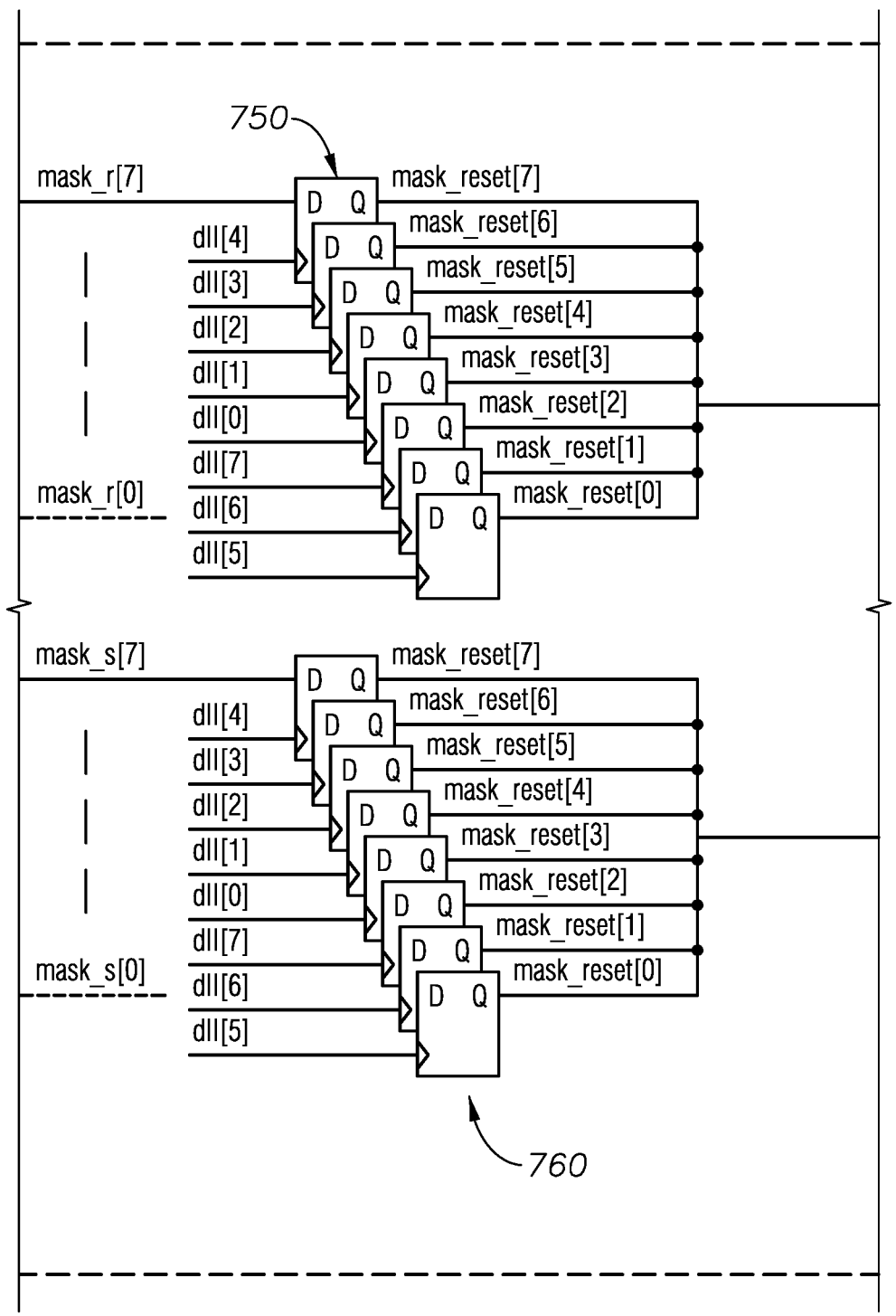
Figure 7C:
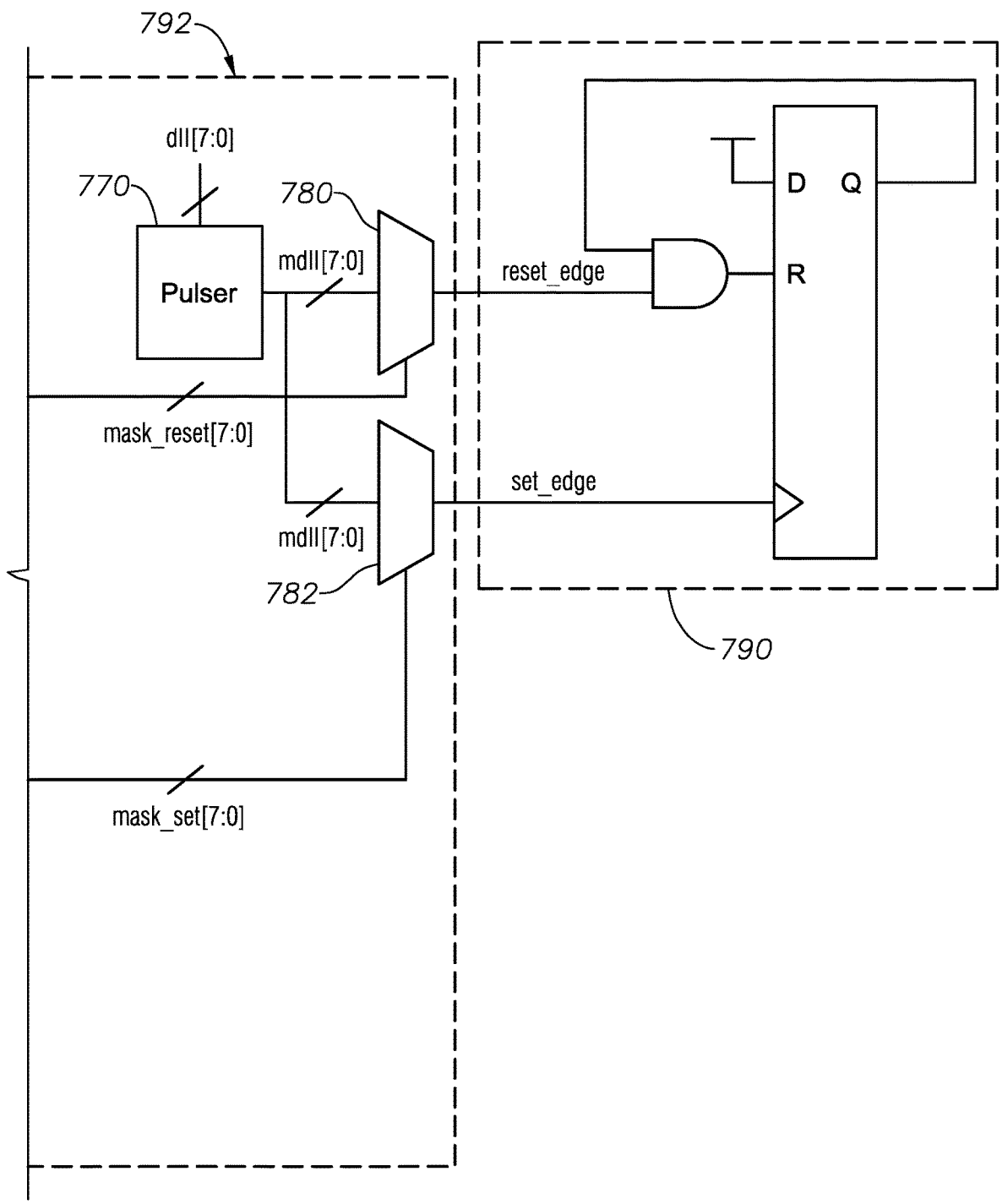
Figure 8:
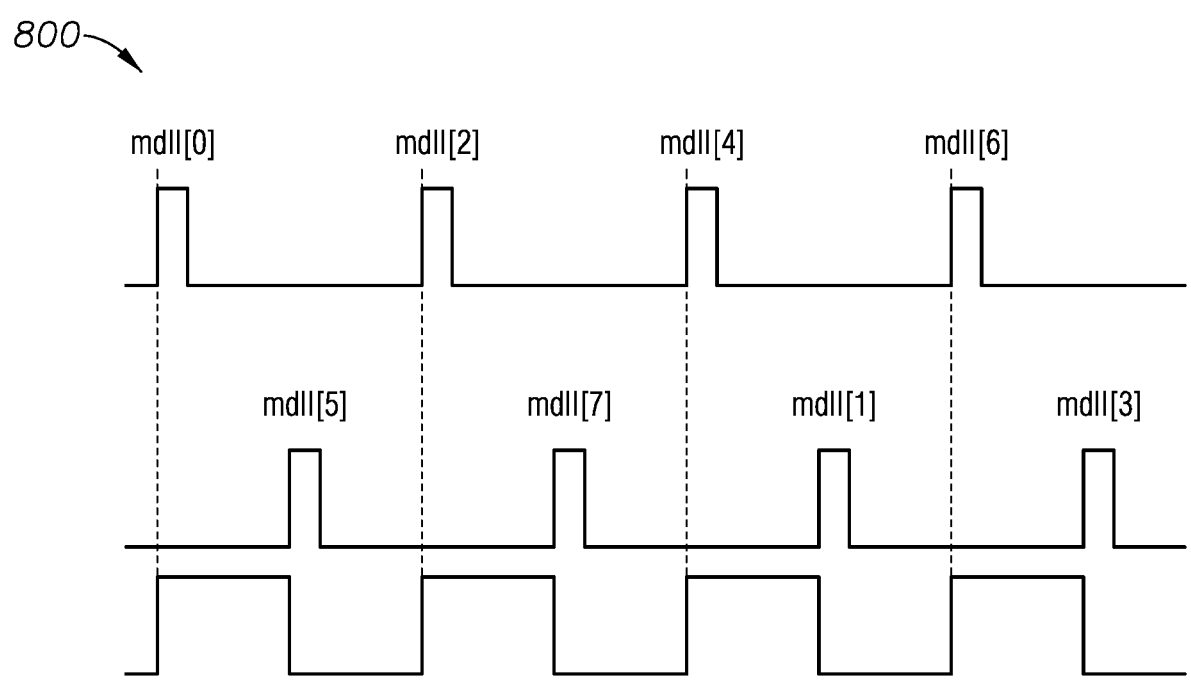
FIG. 8 is a schematic diagram implementable with example circuits and methods.

Referring to FIGS. 7A-C, a diagram of a circuit 700 (i.e., full clock reconstruction circuit,). As may be appreciated, FIGS. 7A-C may be combined to illustrate the circuit 700. In certain implementations the circuit 700 may correspond to circuit 200 (as described with reference to FIG. 2). As shown in FIGS. 7A-C, the circuit 700 includes: a phased-locked loop (PLL) 710, a digital locked loop circuit (DLL) 720, an analog-to-digital converter (ADC) 730, state machine logic 740 (e.g., first and second state machine logic 740a, 740b), first and second flip-flops 750,760 (i.e., delay-able reset and set flip-flops); pulser circuit 770; first and second multiplexers 780, 782; and an edge-sensitive set and reset circuit 790 (i.e., similar to circuit 100). In certain implementations, the circuit 700 may also be arranged as a combination of a clock phase-shifting circuitry 791, clock phase selector circuitry 792, and edge-sensitive set and reset circuitry 793.

The clock phase-shifting architecture 791 as described herein may include the phase locked loop (PLL) 710 and the digital locked loop (DLL) 720. The phase locked loop (PLL) 710 may be configured to: receive a reference clock 702 from an external clocking source, generate a phase locked loop (PLL) clock signal, and provide the phase locked loop (PLL) clock signal to the digital locked loop (DLL) 720. The digital locked loop (DLL) 720 may be configured to: receive the phase locked loop (PLL) 710 clock signal from the phase locked loop (PLL) 710, generate pulse signals with shifted phases based on the phase locked loop (PLL) clock signal, and provide the pulse signals as phase-shifted pulse signals (dll[0] to dll[7]) to the phase selector circuitry 792 (e.g., including first and second state machine logic 740a, 740b; first and second flip-flops 750,760 (i.e., delayable reset and set (RS) flip-flops); pulser circuit 770; first and second multiplexers 780, 782).

In addition, in some instances (not shown), a droop detector (not shown) may be also be utilized to: receive the core voltage signal 704 from an external supply ($V_{DD}$), receive the phase locked loop (PLL) clock signal 702 from the phase locked loop (PLL) 710, generate an internal control signal based on the core voltage signal 704 and the phase locked loop clock signal (i.e., an output signal from the PLL), and provide an internal control signal to a phase shifter (e.g., state machine logic 740a, 740b).

In certain operations, upon detection of a transient voltage (e.g., by a droop detection circuit (not shown)) or as illustrated in FIG. 7A, the receiving of droop information 706 from the core voltage signal ($V_{dd\_core}$) 704, the analog-to-digital converter (ADC) 720 would convert the droop information 706 into a digital code. The digital code would then be output (e.g., adc [7:0]) to first and second state machine logic 740a, 740b. Of note, while the example, as illustrated, shows the digital code as seven bits [7:0], the output can be any number of bits.

Concurrently, in certain cases, also as illustrated in FIG. 7A, the phased-locked loop (PLL) 710 and the delayed lock loop circuit (DLL) 720 can be configured to generate two or more (e.g., several, a plurality) of clock phases (i.e., phase outputs). In some cases, the PLL 710 and DLL 720 (i.e., in combination referred to as an input phase circuit) can be configured to receive a base clock (CLK) signal 702 and generate, e.g., eight (e.g., two or more, a plurality of) clock phases (i.e., dll[0] to dll[7]), where each of the eight clock phases are delayed by 1/8th clock to one another.

Upon receiving the digital droop information (e.g., [7:0], first and second state machine logic 740a, 740b) (i.e., one state machine for set and a second state machine for reset) (i.e., first and second logic of a phase selector circuit 792) may select an input phase (i.e., dll[0] to dll[7]) from the DLL 720.

As may be appreciated, as shown in FIG. 7B, in one example, at the output of the state machine logic 740, the reset and set mask outputs occur at a rising edge of dll[0]. Also, as illustrated, the first and second state machine logics 740a, 740b (i.e., combination logic circuits) can include synchronous state machine outputs on two buses: 1) a mask for reset (e.g., one of mask_reset [0] to mask_reset [7]) (750) and 2) a mask for set (e.g., one of mask_set [0] to mask_set [7]) (760). From that starting point, each of the reset and set masks can be delayed from dll[0] through dll[7]. Hence, at this point for both set and reset, selection windows may be shifted (according to inventive aspects as described herein with reference to FIGS. 3-6) so that a desired pulse to be selected lies within the selection windows.

In FIG. 7B, as an example, while a series of D-flip-flops are shown to represent D-flip-flop delay of the reset mask, just one D-flip flop 750 would be present in the circuitry and just one mask_reset would be correspondingly chosen. Similarly, while a series of D-flip-flops are shown to represent D-flip-flop delay of the set mask, just one D-flip flop 760 would be present in the circuitry and just one mask_reset would be correspondingly chosen. As illustrated, the series of flip-flops 750, 760 are configured to delay each respective mask to appear at a correct "moment" (i.e., shifting respective selection windows) to select the mdll (i.e., pulse, a modified slightly shorter signal from the DLL 720).

With reference to FIGS. 7B-7C, the selection procedure of respective masks for both set and reset is performed by the multiplexer 780 for reset and the multiplexer 782 for set. Also, the selection procedure may be conducted in accordance to FIGS. 3-6 and the inventive adaptive window synchronization methodology. As illustrated, in the example of FIG. 7B, each of the DLL outputs (i.e., DLL0 to DLL7) and respective pulser outputs (i.e., mask_reset [7:0] or mask_set [7:0]) correspond to the "balanced" selection windows (as described, e.g., with reference to FIG. 5). In other implementations, the DLL outputs and respective pulser outputs can follow "uneven" selection windows (as described, e.g., with reference to FIG. 6). With reference to FIG. 7C, output from the multiplexers 780, 782 are the respective reset and set (reset_edge and set_edge) pulses that are input into the edge-sensitive set and reset circuit 793 (e.g., explained in further detail with reference to FIG. 1).

In other implementations (not shown), the inventive clock phase-shifting architecture 700 may also provide for a post scalar output circuit (not shown) that receives the output clock signal from the phase shifter, generates a scaled output clock signal based on the output clock signal, and then provides the scaled output clock signal to an external computing device.

Referring to FIG. 8, in an example operation, a state machine (e.g., state machine logic 212, 214 in FIG. 2, state machine logic 740a, 740b in FIG. 7A), embedded in a clock reconstruction circuit (e.g., circuit 200, 700), would select the correct rising edges of DLL outputs. In one example, the state machine would select phases (mdll [7:0]) (i.e., modified dll outputs)) of the DLL 720. In operation, when the DLL outputs 0-7 are correctly selected, the circuit (e.g., 200, 700) would output reset and set pulses (i.e., reset_edge and set_edge).

For instance, by selecting mdll [0] (which corresponds to the DLL0 phase), the output would go to "1", then the selection of mdll[5] (which would correspond to DLL5 phase) would transition the output to "0". Next, for example, mdll [2] (which corresponds to the DLL2 phase) would be selected, which would transition the output back to "1". In this manner, the set edge would correspond to mdll [0], mdll [2], mdll [4], mdll [6], etc., while the reset edge would correspond to mdll [5] mdll [7], mdll [1], mdll [3], etc. In an example, as shown, mdll corresponds to modified DLL outputs. As may be appreciated, each of the DLL outputs would have a 50% duty cycle. Also, in certain examples as described herein, each of the DLL outputs can be delayed by $\frac{1}{8}^{th}$ of each. In another example, the pulse may be reduced to $\frac{2}{8}^{th}$ of the clock period, and thus can have a duty cycle of 25% (instead of 50%). Advantageously, smaller pulses can be easier to control with the respect to the full clock reconstruction circuit (200, 700).

Referring to FIG. 9, a flowchart of an example method 900 (i.e., procedure) to prevent incorrect phase selection, reduce clock glitches, noise, and/or clock jitter is shown. Advantageously, in various implementations, the method 900 depicts for active window synchronization. The method 900 may be implemented with reference to circuit implementations and operations as depicted in FIGS. 1-8 and 10 and/or combinations thereof.

At block 910, the method includes providing, by a DLL, a plurality of phase outputs. For instance, with reference to various implementations as described in FIGS. 1-8 and 10, a plurality of phase outputs (e.g., DLL outputs, DLL[0] to DLL[7]) may be provided by a DLL (e.g., DLL 720).

At block 920, the method includes determining, by respective logic circuits, respective pulses to be selected for an output clock corresponding to each of the plurality of clock phases (i.e., phase outputs). For instance, with reference to various implementations as described in FIGS. 1-8 and 10, the method includes respective pulses (of a plurality of pulser outputs) (e.g., Pulse 0-7) to be selected for an output clock (i.e., pulser output, mask output) (e.g., 340, 440, Pulse[7:0]), mask_reset [7:0], mask_set [7:0]) corresponding to each of the plurality of clock phases (i.e., phase outputs) (e.g., DLL outputs, DLL[0] to DLL[7]) may be determined by respective logic circuits (i.e., respective state machines) (e.g., a state machine for each of the DLL outputs; state machine logics (i.e., combination logic circuits) 212, 214; 740a, 740b).

At block 930, the method includes shifting respective selection windows of the pulses such that each of the selection windows fully overlap the corresponding respective determined pulse. Also, the selection windows can be synchronized to one or more clock periods of the phase outputs. For instance, with reference to various implementations as described in FIGS. 1-10, the method includes shifting (i.e., delaying) respective selection windows (i.e., clock masks) (i.e., change the synchroneity of the select window) of the pulses (e.g., Pulse 0-7) such that each of the selection windows fully (i.e., completely) overlap the corresponding respective determined pulses. Also, the selection windows are synchronized to one or more clock periods (e.g., clock period "X"). At block 940, the method includes selecting the pulses. For instance, with reference to various implementations as described in FIGS. 1-8 and 10, the method includes selecting the pulses (e.g., Pulse 0-7).

Figure 10:
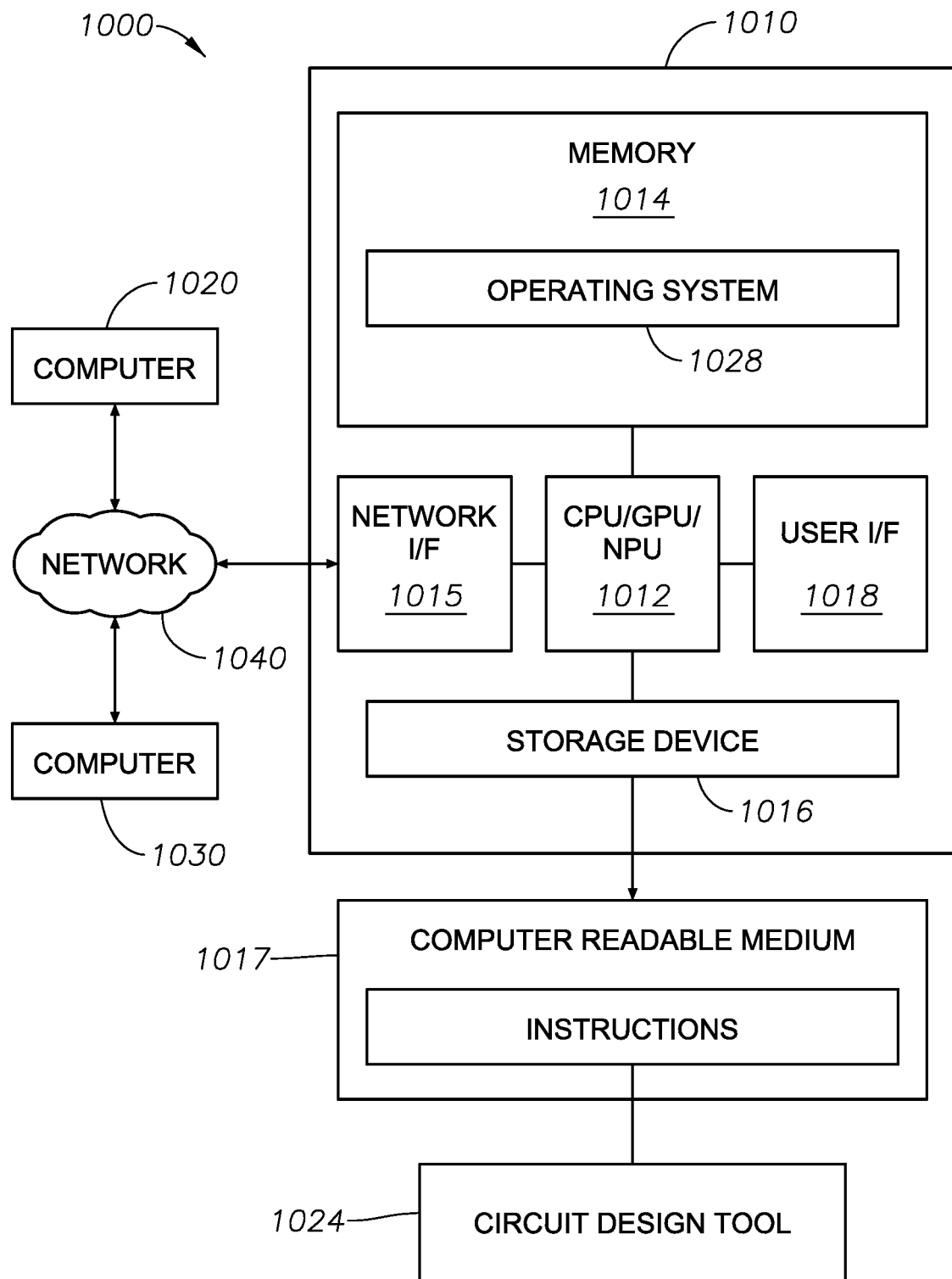
FIG. 10 is a schematic block diagram implementable with example circuits and methods.

FIG. 10 illustrates example hardware components in the computer system 800 that may be used to prevent unwanted glitches and incorrect phase selection to optimize the output set or reset clock signal. In certain implementations, the example computer system 1000 (e.g., networked computer system and/or server) may include a circuit design tool 1024 (i.e., an elective fine-grain adaptive clocking circuit design tool) and execute software based on the procedure as described with reference to the description in FIGS. 3-6 and method 900 in FIG. 9. In certain implementations, the circuit design tool 1024 may be included as a feature of an existing memory compiler software program.

In some cases, the circuit design tool 1024 may provide generated computer-aided physical layout designs for memory architecture. The procedure (as described with reference to FIG. 9) may be stored as program code as instructions 1017 in the computer readable medium of the storage device 1016 (or alternatively, in memory 1014) that may be executed by the computer 1010, or networked computers 1020, 1030, other networked electronic devices (not shown) or a combination thereof. In certain implementations, each of the computers 1010, 1020, 1030 may be any type of computer, computer system, or other programmable electronic device. Further, each of the computers 1010, 1020, 1030 may be implemented using one or more networked computers, e.g., in a cluster or other distributed computing system.

In certain implementations, the system 1000 may be used with semiconductor integrated circuit (IC) designs that contain all standard cells, all blocks or a mixture of standard cells and blocks. In a particular example implementation, the system 1000 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 100 may be stored in one or more of memory 1014 or storage devices 1016 of computer 1010 or in networked computers 1020, 1030.

The system 1000 may perform the following functions automatically, with variable user input: providing, by a digital locked loop (DLL), a plurality of phase outputs; determining, by respective logic circuits, respective pulses to be selected for an output clock corresponding to each of the plurality phase outputs; shifting respective selection windows of the pulses such that each of the selection windows fully overlap the corresponding respective determined pulses; and selecting the pulses. In some instances, such functions may be performed substantially via user input control. Additionally, such functions can be used in conjunction with the manual capabilities of the system 1000 to produce the target results that are required by a designer.

In one implementation, the computer 1000 includes a processing unit 1012 having at least one hardware-based processor coupled to a memory 1014. In certain implementations, the processing unit 1012 may include one or more of a central processing unit (CPU), a graphical processing unit (GPU) or a neural processing unit (NPU). The memory 1014 may represent random access memory (RAM) devices of main storage of the computer 1010, supplemental levels of memory (e.g., cache memories, non-volatile or backup memories (e.g., programmable or flash memories)), read-only memories, or combinations thereof. In addition to the memory 1014, the computer system 1000 may include other memory located elsewhere in the computer 1010, such as cache memory in the processing unit 1012, as well as any storage capacity used as a virtual memory (e.g., as stored on a storage device 1016 or on another computer coupled to the computer 1010).

The computer 1010 may further be configured to communicate information externally. To interface with a user or operator (e.g., a circuit design engineer), the computer 1010 may include a user interface (I/F) 1018 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 1010 may include a network interface (I/F) 1015 which may be coupled to one or more networks 1040 (e.g., a wireless network) to enable communication of information with other computers and electronic devices. The computer 1060 may include analog and/or digital interfaces between the processing unit 1012 and each of the components 1014, 1015, 1016, and 1018. Further, other non-limiting hardware environments may be used within the context of example implementations.

The computer 1010 may operate under the control of an operating system 1026 and may execute or otherwise rely upon various computer software applications, components, programs, objects, modules, data structures, etc. (such as the programs associated with the procedure 900 and related software). The operating system 1028 may be stored in the memory 1014. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/OS® (a registered trademark of IBM Corp.), and others as will occur to those of skill in the art. The operating system 1026 in the example of FIG. 10 is shown in the memory 1014, but components of the aforementioned software may also, or in addition, be stored at non-volatile memory (e.g., on storage device 1016 (data storage) and/or the non-volatile memory (not shown). Moreover, various applications, components, programs, objects, modules, etc. may also execute on one or more processors in another computer coupled to the computer 1010 via the network 1040 (e.g., in a distributed or client-server computing environment) where the processing to implement the functions of a computer program may be allocated to multiple computers 1020, 1030 over the network 1040.

In example implementations, circuit diagrams and representations have been provided in FIGS. 1-10, whose redundant description has not been duplicated in the related description of analogous circuit diagrams and representations. It is expressly incorporated that the same layout diagrams with identical symbols and/or reference numerals are included in each of embodiments based on its corresponding figure(s).

Although one or more of FIGS. 1-10 may illustrate systems, apparatuses, or methods according to the teachings of the disclosure, the disclosure is not limited to these illustrated systems, apparatuses, or methods. One or more functions or components of any of FIGS. 1-10 as illustrated or described herein may be combined with one or more other portions of another of FIGS. 1-10. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 814, the storage device 816, or both, include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A circuit comprising:
a flip-flop; and
an AND gate, wherein:
the circuit is configured to generate edge-sensitive set and reset signals, the circuit comprises solely the flip-flop and the AND gate, and the output of the flip-flop is provided as a feedback to the AND gate to generate the edge-sensitive reset signal transmitted to the flip-flop.

2. The circuit of claim 1, wherein the flip-flop comprises a D-flip-flop.

3. The circuit of claim 2, wherein:
an output of the D-flip-flop is a first input of the AND gate,
a reset input signal is a second input of the AND gate,
the output of the AND gate is the edge-sensitive reset signal.

4. The circuit of claim 1, wherein a D input to the flip-flop is set to a digital "1".

5. The circuit of claim 1, wherein a set input signal of the circuit corresponds to a rising edge of an output clock signal of a phase selector circuit, and wherein a reset input signal of the circuit corresponds to a falling edge of the output clock signal of the phase selector circuit.

6. The circuit of claim 5, wherein the set input signal and reset input signal correspond to rising edges of different delayed locked loop (DLL) output phases.

7. A circuit comprising:
a plurality of logic circuits configured to generate set and reset signals; and
an edge-triggered reset-set (RS) latch configured to receive the set and reset signals, and output edge-triggered set and reset signals, wherein the plurality of logic circuits comprise:
first and second state machine logic circuits;
first, second, third, and fourth data latches;
first, second, third, and fourth NAND gates;
first and second NOR gates; and
a pulser circuit.

8. The circuit of claim 7, wherein the plurality of logic circuits comprise circuits comprise clock phase-shifting circuitry and clock phase selector circuitry.

9. The circuit of claim 8, wherein the clock phase-shifting circuitry comprises: a phase locked loop (PLL) and a digital locked loop (DLL), and wherein the clock phase selector circuitry comprises: first and second state machine logic circuits, first and second data latches; first and second multiplexers, and a pulser circuit.

10. The circuit of claim 8, wherein the clock phase selector circuitry is configured to shift a respective clock mask to fully select a clock signal pulse.

11. The circuit of claim 7, wherein the edge-triggered RS latch comprises: a flip flop; and an AND gate.

12. A circuit comprising:
a D-flip-flop; and
an AND gate, wherein:
the circuit is configured to generate edge-sensitive set and reset signals, an output of the D-flip-flop is a first input of the AND gate, a reset input signal is a second input of the AND gate,
the output of the AND gate is the edge sensitive reset signal transmitted as an input of the D-flip-flop.

13. A circuit comprising:
a flip-flop; and
an AND gate, wherein:
the circuit is configured to generate edge-sensitive set and reset signals, a set input signal corresponds to a rising edge of an output clock signal of a phase selector circuit,
a reset input signal corresponds to a falling edge of the output clock signal of the phase selector circuit, and
the edge-sensitive reset signal is an input of the flip-flop.

14. A circuit comprising:
a plurality of logic circuits configured to generate set and reset signals; and
an edge-triggered reset-set (RS) latch configured to receive the set and reset signals, and output edge-triggered set and reset signals, wherein the plurality of logic circuits comprise clock phase-shifting circuitry and clock phase selector circuitry, wherein the clock phase selector circuitry is configured to shift a respective clock mask to fully select a clock signal pulse.

15. The circuit of claim 14, wherein the clock phase-shifting circuitry comprises: a phase locked loop (PLL) and a digital locked loop (DLL), and wherein the clock phase selector circuitry comprises: first and second state machine logic circuits, first and second data latches; first and second multiplexers, and a pulser circuit.

16. The circuit of claim 14, wherein the DLL is configured to provide a plurality of phase outputs.

17. The circuit of claim 16, wherein each of the plurality of logic circuits are configured to determine a respective pulse to be selected for an output clock corresponding to each of the plurality of phase outputs.

18. The circuit of claim 17, wherein a selection window is configured to be shifted to overlap the corresponding determined pulse.

* * * * *